United States Patent [19]
Gagnon et al.

[11] Patent Number: 6,167,552
[45] Date of Patent: Dec. 26, 2000

[54] APPARATUS FOR CONVOLUTIONAL SELF-DOUBLY ORTHOGONAL ENCODING AND DECODING

[76] Inventors: Francois Gagnon, 135, 56th Avenue, Lachine, (Quebec), Canada, H8T 3B8; David Haccoun, 57, Strathcona, Mont-Royal, (Quebec), Canada, H3R 1E5; Naim Batani, 355, Blue Haven, Dollard des Ormeaux, (Quebec), Canada, H9G 1S8; Christian Cardinal, 1600, St-Jacques West, appt. 5, Montréal, (Quebec), Canada, H3J 2W4

[21] Appl. No.: 08/942,787

[22] Filed: Oct. 2, 1997

[51] Int. Cl.[7] .................................................. H03M 13/03

[52] U.S. Cl. ........................................... 714/793; 714/760

[58] Field of Search ........................... 375/341; 384/422; 371/43; 714/794, 793, 760; 340/146.1

[56] References Cited

U.S. PATENT DOCUMENTS

| | | | |
|---|---|---|---|
| 3,697,947 | 10/1972 | Macy . | |
| 3,728,678 | 4/1973 | Tong | 714/787 |
| 3,873,971 | 3/1975 | En | 714/793 |
| 4,110,735 | 8/1978 | Maxemchuk | 714/793 |
| 4,119,945 | 10/1978 | Lewis, Jr. et al. | 714/793 |
| 4,404,674 | 9/1983 | Rhodes | 714/794 |
| 4,462,101 | 7/1984 | Yasuda et al. | 714/794 |
| 4,476,458 | 10/1984 | Dollard . | |
| 4,521,886 | 6/1985 | Dollard et al. . | |
| 5,159,608 | 10/1992 | Falconer et al. . | |
| 5,193,094 | 3/1993 | Viterbi . | |
| 5,390,198 | 2/1995 | Higgins . | |
| 5,398,069 | 3/1995 | Huang et al. | 348/422 |
| 5,410,556 | 4/1995 | Yeh et al. | 714/795 |
| 5,446,747 | 8/1995 | Berrou . | |
| 5,465,267 | 11/1995 | Todoroki . | |

OTHER PUBLICATIONS

C. E. Shannon, "A Mathematical Theory of Communication," Bell Syst. Tech. J. vol. 27, pp. 379–423, 1948.

L.R. Bahl, J. Cocke, F. Jelinek, and J. Raviv, "Optimal Decoding of Linear Codes for Minimizing Symbol Error Rate," IEEE, Transactions on Information Theory, vol. IT–20, pp. 248–287, Mar. 1974.

S.S. Pietrobon, "Implementation and Performance of a Serial MAP Decoder for use in an Iterative Turbo Decoder," 1995 IEEE International Symposium on Information Theory, Whisler, Canada, Sep. 1995.

C. Berrou, A. Glavieux, and P. Thitimajshima, "Near Shannon Limit Error–Correcting Coding and Decoding: Turbo Codes," IEEE 1993 Symposium, Geneva, May 1993.

J. Hagenauer and L. Papke, "Decoding 'Turbo'–Codes with Soft Output Viterbi Algorithm (SOVA)," Proceedings ISIT 1994, pp. 164, Trondheim, Norway, Jun. 1994.

V. Bhargava, D. Haccoun, R. Matyas, and P. Nuspl, "Digital Communications by Satellite: Multiple Access Modulation and Coding," pp. 374–382, New York, 1981.

S. Benedetto and G. Montorsi, "Unveiling Turbo Codes: Some results on Parallel Concatenated coding Schimes, "IEEE Transactions on Information Theory, vol. IT–42, No. 2, pp. 409–428, Mar. 1996.

(List continued on next page.)

*Primary Examiner*—Albert De Cady
*Assistant Examiner*—David Ton
*Attorney, Agent, or Firm*—Rogers & Killeen

[57] ABSTRACT

An encoder and decoder for generating and decoding convolutional codes of improved orthogonality. In an exemplary embodiment the encoder includes a K-bit length shift register for receiving an input serial stream of information bits and providing for each input bit a K-bit parallel output to a self-doubly orthogonal code sequence generator. The encoded symbol stream is threshold decoded iteratively using the inversion of the convolutional self-doubly orthogonal parity code generators.

22 Claims, 4 Drawing Sheets

OTHER PUBLICATIONS

S. Benedetto and G. Montorsi, "Unveiling Turbo Codes: Some results on Parallel Concatenated Codes," Proceedings 1995 IEEE International Symposium on Information Theory, Whisler, Canada, Sep. 1995.

J. L. Massey, Threshold Decoding, Cambridge, MA. 1963.

W. W. Wu, "New Convolutional Codes—Part I," IEEE Transactions on Communications, vol. COM–23, No. 9, pp. 942–956, Sep. 1975.

W. W. Wu, "New Convolutional Codes—Part II," IEEE Transactions on Communications, vol. COM–24, pp. 946–955, Sep. 1976.

H. Tanaka, K. Furusawa, and S. Kaneku, "A Novel Approach to Soft Decision Decoding of Threshold Decodable Codes," IEEE Transactions on Information Theory, vol. IT–26, pp. 244–246, Mar. 1980.

C. C. H. Yu and D. J. Costello, "Generalized Minimum Distance Decoding Algorithm for Q–ary Output Channels", IEEE Transactions on Information Theory, vol. COM–39, pp. 200–207, Feb. 1991.

P. Lavoie, D. Haccoun, and Y. Savaria, "New VLSI Architectures for Fast Soft–Decision Threshold Decoders," IEEE Transactions on Communications, vol. COM–39, pp. 200–207, Feb. 1991.

F. Gagnon, N. Batani, and T. Q. Dam, "Simplified Designs for AAPP Soft Decision Threshold Decoders," IEEE Transactions on Communications, vol. 43 No. 2/3/4 Feb./Mar./Apr. 1995.

S. Lin and D. J. Costello, "Error Control Coding: Fundamentals and Applications," pp. 51, 287 and 388–392, Englewood Cliff, New Jersey, 1983.

J. M. Aurada, "Introduction to Artificial Neural Nets," pp. 175–185 and 206–209, St. Paul, MN, 1992.

J. C. Clark, Jr. and J. B. Cain, "Error–Correcting Coding for Digital Communications," p. 49 and 227, New York, 1982.

A. J. Viterbi, "Convolutional Codes and Their Performance in Communications Systems," IEEE Transactions on Communications Technology, vol. COM–19, Oct. 1971.

C. Berrou and A. Glavieux, "Near Optimum Error Correcting Coding and Decoding," IEEE Transactions on Communications, vol. 44 No. 10, Oct. 1996.

J. Hagenauer, E. Offer, and L. Papke, "Iterative Decoding of Binary Block and Convolutional Codes," IEEE Transactions on Information Theory, vol. 42, Mar. 1996.

APPARATUS FOR CONVOLUTIONAL SELF-DOUBLY ORTHOGONAL ENCODING AND DECODING

BACKGROUND OF THE INVENTION

This invention relates to data encoding and decoding of digital information transmitted over a communication channel. In particular, the invention relates to coding and iterative threshold decoding of convolutional self-doubly orthogonal codes.

In modern electronic communications, information is generally transmitted in a discrete digital format. In various applications such as wireless telephonic communications or satellite communications the transmitted information signal is susceptible to corruption due to noise in the communication channel (i.e., electronic interference in the transmission medium). To improve transmission reliability and accuracy, the prior art discloses channel coding as an error correcting technique. The two principal error correcting techniques are block and convolutional coding.

In convolutional coding, parity bits derived from a span of information bits are added to the information bits for redundancy. The information bit span length is called the constraint length. Convolutional codes usually operate over long streams of information bits, which could be broken into shorter blocks. Whether or not broken into blocks, the streams of information bits are encoded in a continuous manner by a simple linear apparatus called a convolutional encoder.

In a basic convolutional encoder, the encoder encodes a stream of information bits by breaking the information stream into blocks of N information bits and by performing a logical exclusive-or operation on the most recently received N bit block. For systematic convolutional encoders, the resulting parity bit from the encoder's calculation is appended for redundancy to the information bits before transmission. Therefore, the final transmitted message will consist of the most recently received information bits and the parity bit output of the logical exclusive-or operation.

Variations of this simple form includes convolution encoders in which, for example, the encoder calculates parity bits from the most recently received eight bit information block and selected information bits of pervious blocks. The encoder's coding rate (i.e., the number of information bits per parity bits) may also be adjusted to improve reliability or accuracy of the decoded information.

Self-orthogonal convolutional codes are specific types of convolutional codes. In self orthogonal convolutional code the transmitted parity bits corresponding to each transmitted information bit are generated by the encoder in such a way that no two parity equations include more than one symbol in common. As a consequence, for decoding, a simple majority rule on the parity equations can be implemented for obtaining an estimate on each received information bit.

In order to further improve the reliability of the transmitted data, several techniques based on multi-level coding and utilizing the serial or parallel concatenation of codes have been developed. Turbo encoding is one such technique. Turbo encoding may be regarded as encoding the information sequence twice, once using a first encoder, and then, using a second encoder but operating on a scrambled or interleaved version of the same sequence. In principle, any number of encoders separated by random interleavers may be used, but the structure is usually limited to two encoders with a single interleaver between them. In these techniques the convolutional codes are generally of the recursive systematic type, that is, the information bits are not altered by the encoding process and are transmitted along the encoded accompanying redundant symbols. A key to the improved performance of the Turbo coding technique is that because of the interleaving or scrambling between each successive encoder operation, each encoder appears to operate on a set of independent information data.

As to decoding, convolutional codes may be decoded using the well-known methods of maximum likelihood sequence estimation techniques such as the Viterbi algorithm. Another well-known decoding technique which is especially well suited for self-orthogonal convolutional codes is threshold decoding. Threshold decoding may be implemented with or without feedback and with a hard or soft quantized input.

Generally, decoding of Turbo codes is performed in iterations of two steps. On the first step, the first decoder operates on the soft output of the channel pertaining to the code symbols of the first encoder, and provides to the second decoder information on the reliability of the decoded sequence. Likewise, the second decoder operates on the interleaved version of the estimated information sequence it receives from the first decoder together with a reliability information measure on that sequence and its appropriate code symbols. The process is repeated iteratively whereby the second decoder feeds back soft output reliability information to the first decoder and the process may be repeated anew any number of times. As in the encoding, the interleaving or scrambling allows iterative decoding to be performed over a set of uncorrelated observables.

More specifically, two decoding methods for Turbo Codes have been considered. The symbol-by-symbol Maximum A Posteriori Probability, MAP, algorithm due to Bahl, et al., "Optimal Decoding of Linear Codes for Minimizing Symbol Error Rates", *IEEE Transactions on Information Theory*, Vol. IT-20, March 1976, and the Soft-Input Soft-Output Viterbi decoding algorithm, SOVA. See U.S. Pat. No. 4,811,346 issued to Battail and U.S. Pat. No. 5,537,444 issued to Nill, et al. Both of these decoding algorithms suffer from a rather large computational complexity which prompted the development of some simplifying variants. In addition to the decoding complexity, Turbo Codes present the further disadvantage of an inherent latency or delay which is due to the presence of an interleaver and the number of iterations that are required to achieve a given error probability. This delay may be quite large, even unacceptable to many delay-sensitive applications. In some applications such as encountered in wireless communications for example, both the decoder complexity and latency conspire to make the traditional Turbo coding technique unsuitable.

Accordingly, it is an object of the present invention to provide a novel and improved encoder and decoder based on using convolutional self doubly orthogonal codes together with iterative threshold-type decoding.

It is another object of the present invention to provide novel iterative encoders and decoders for convolutional codes without increased complexity and latency caused by interleaving.

It is yet another object of the present invention to provide novel iterative hard or soft quantized decoders based on Turbo decoders without interleaving or scrambling.

It is still another object of the present invention to provide a novel iterative feedback decoder for convolutional codes with error propagation constrained by the coding scheme and weighing of feedback decisions.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

For Viterbi-like iterative decoding of convolutional codes (i.e., Turbo Decoding), an interleaver is used to insure that decoding is applied on different independent sets of observables. To obtain the same effect without interleaving for iterative threshold decoding, Convolutional Self Doubly Orthogonal Codes are implemented.

Figure 1:
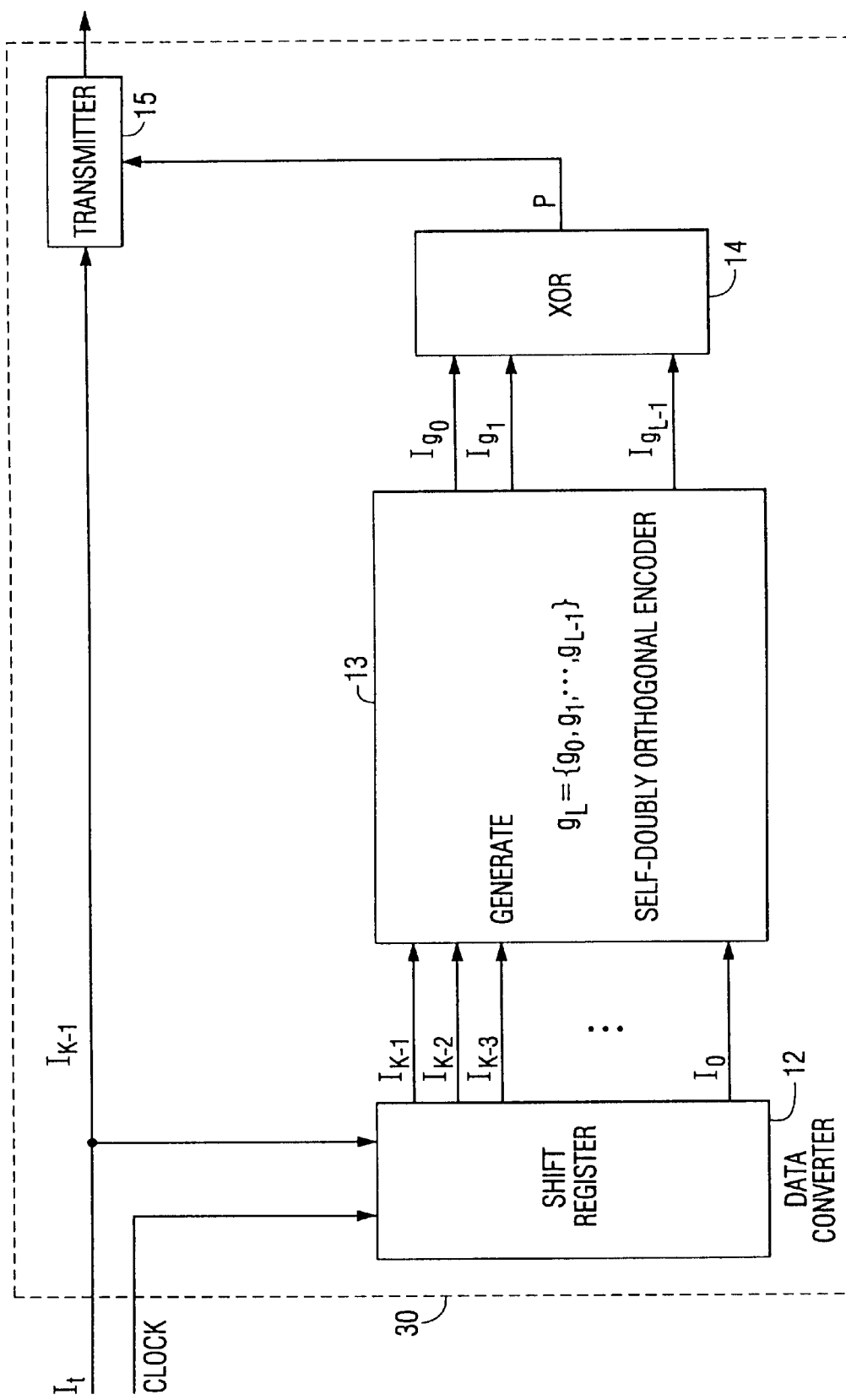
FIG. 1 is a block diagram illustrating, in an exemplary embodiment, a convolutional encoder for generating convolutional self-doubly orthogonal codes in accordance with the present invention.

FIG. 1 illustrates in block diagram form an exemplary embodiment of a convolutional self-doubly orthogonal encoder of the present invention. In the embodiment illustrated in FIG. 1, convolutional self-doubly orthogonal encoder 30 is of a constraint length K.

In FIG. 1, shift register 12 receives a serial stream of information bits $I_r$. Upon each clock pulse, the self-doubly orthogonal coder 13 receives a parallel output of the most recent $I_{K-1}$ to the K–1 least recent information bits $I_0$ from shift register 12.

The self-doubly orthogonal encoder 13 selects a subset L of the K information bits in a sequence that meets the definition of convolutionally self-doubly orthogonal codes.

A convolutional code of rate 1/2 is convolutionally self-doubly orthogonal code, if for all of the following combination of indices:

$$0 \le j < J, 0 \le k < j, 0 \le n < J, 0 \le p < n, n \ne k, p \le k$$

1) the differences of generators, $(g_j-g_k)$, are distinct,
2) the sum of differences, $(g_j-g_k+g_n-g_p)$, are distinct and
3) the sum of differences are distinct from the differences.

The exclusive-or gate 14 receives the parallel stream of the selected sequence of information bits generated by the self-doubly orthogonal encoder 13. The exclusive-or (XOR) gate 14 performs a logical exclusive-or operation on the L selected information bits, thereby generating a parity bit output P. Transmitter 15 receives the parity bit output from the exclusive-or gate and the most recent input information bit.

Transmitter 15 packages the parity bit and the information bit into coded messages and transmits these messages through a communication channel.

The self-doubly orthogonal encoder 13 may also select a subset L of the K information bits in a sequence that meets the definition of convolutionally self-multiply orthogonal codes. In such encoders the encoder generates further sequences such that for all variations of W pairs of additional indices $q_u$ and $r_u$ where $1 \le u \le W$, $0 \le q_u < L$, $0 \le r_u < q_u$, $n \ne q_u \ne k$, $r_u < p \le k$, except for unavoidable cases, the differences of $g_n$ for each pair of indices $q_u$ and $r_u$, $(g_q-g_r)$ are distinct, the sum of differences $(g_j-g_k+g_n-g_p)$ are distinct, the sum of differences $$\left(g_j - g_k + g_n - g_p + \sum_{u=1}^{W}(g_{q_u} - g_{r_u})\right)$$

are distinct, all sums of differences are distinct from all differences, and all the differences are distinct from each other.

Figure 2:
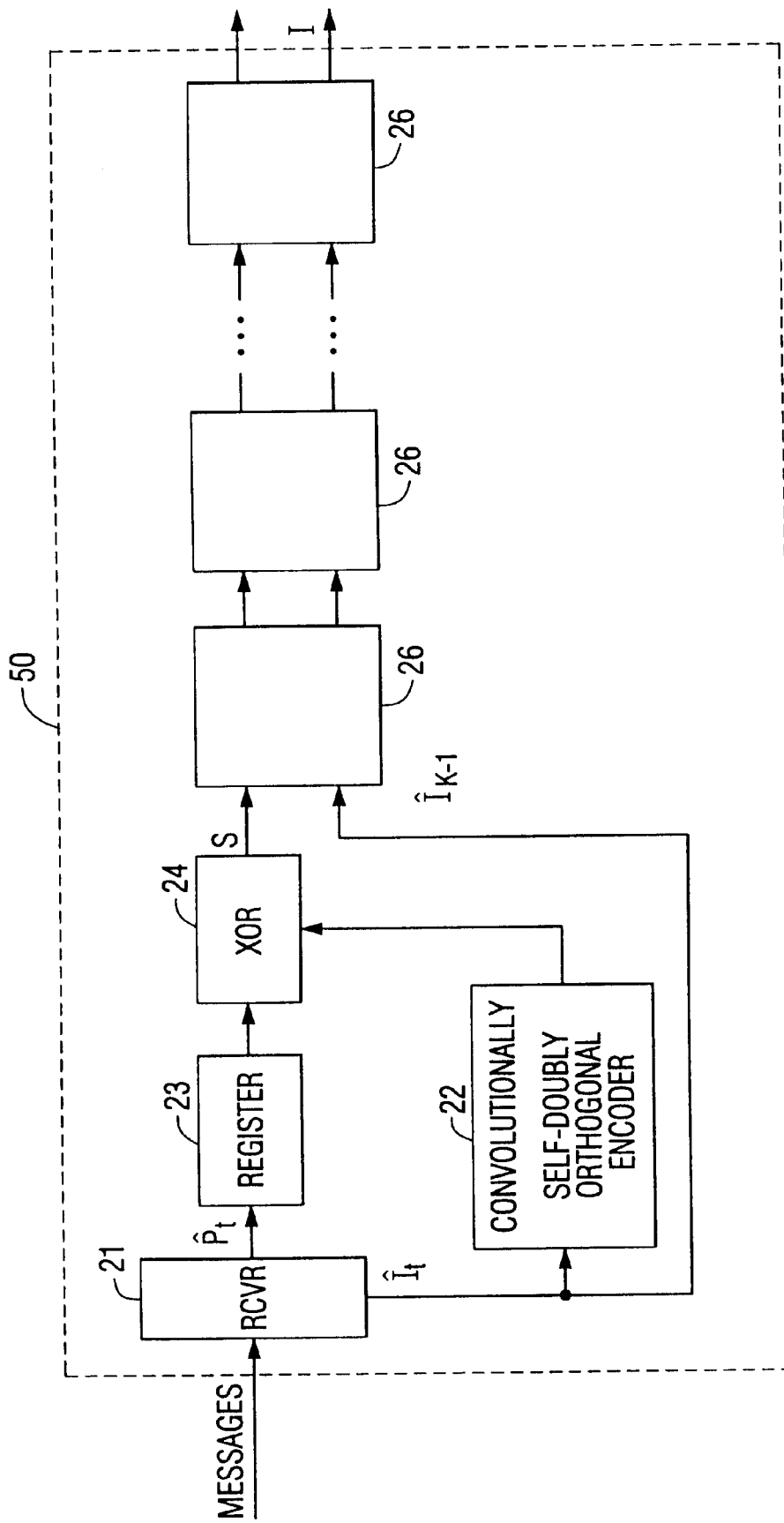
FIG. 2 is a block diagram illustrating, in an exemplary embodiment, a decoder for decoding convolutional self-doubly orthogonal codes in accordance with the present invention.

FIG. 2 illustrates an exemplary embodiment of a hard quantized convolutional self-doubly orthogonal decoder. The convolutional self-doubly orthogonal decoder 50 of FIG. 2 illustrates an exemplary embodiment of a hard iterative threshold decoder for rate 1/2 convolutional self-doubly orthogonal codes. Data receiver 21 receives messages transmitted through a communication channel. The data receiver 21 detects and divides the message into its parity and information components. The convolutional self-doubly orthogonal encoder 22 receives the most recently received information bit $\hat{I}_{K-1}$ from the data receiver 21.

The convolutional self-doubly orthogonal encoder 22 is essentially the encoder of FIG. 1. The encoder 22 estimates the transmitted parity bit by convolutionally self-doubly orthogonal encoding the received information bits thereby estimating the received parity bit. The shift register 23 receives the stream of received parity bits from the data receiver in a FIFO register. The exclusive-or gate 24 receives the estimated convolutional self-doubly orthogonal code parity bit and the received convolutional self-doubly orthogonal code parity bit from the shift register 23. The exclusive-or gate 24 performs a logical exclusive-or operation on the estimated and received parity bits.

The first threshold decoder stage 26 receives the output of the exclusive-or operation of the exclusive-or gate 24 (i.e., the syndrome bits) and the least recently received information bit $I_K$.

Figure 3:
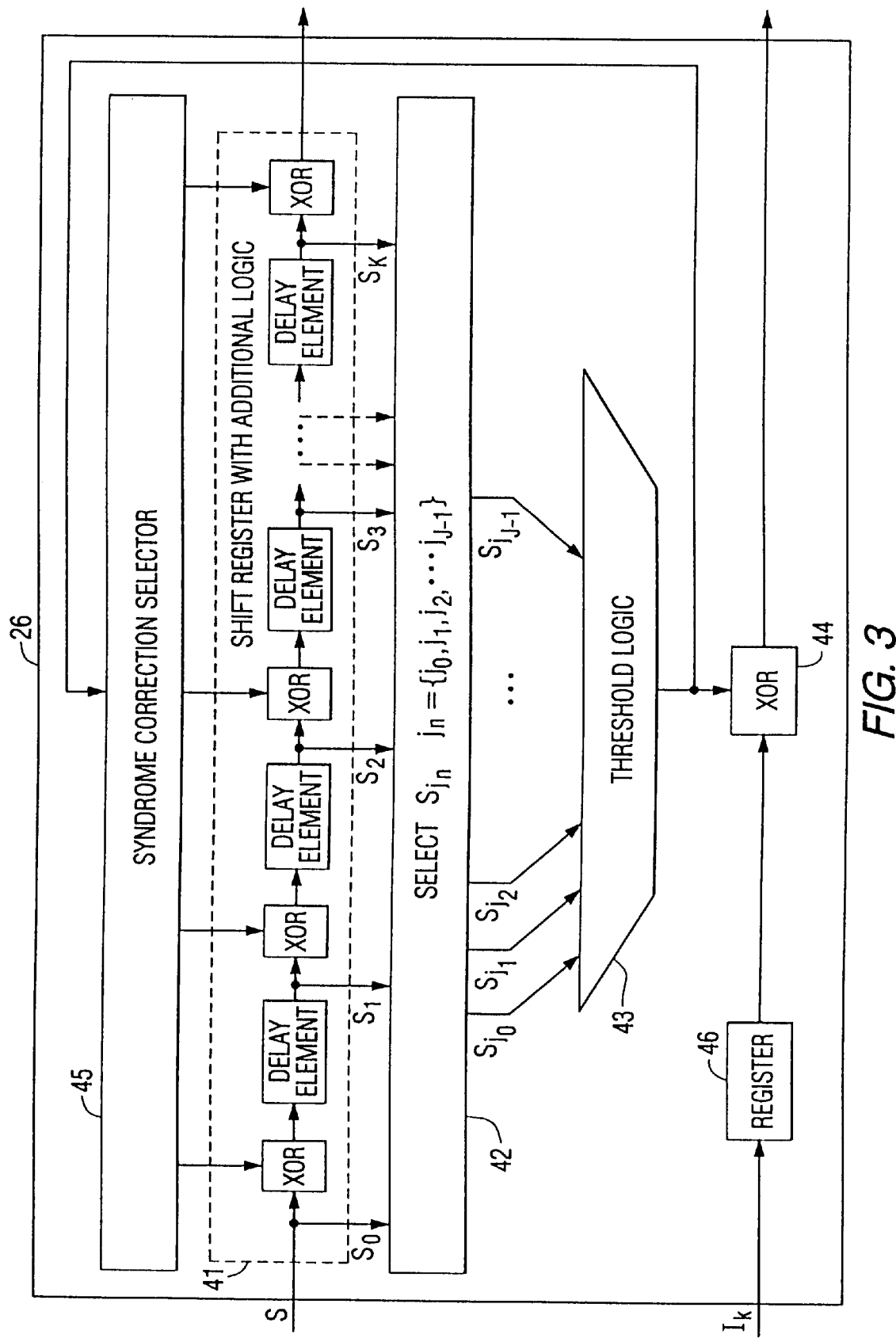
FIG. 3 is a block diagram illustrating, in an exemplary embodiment, a threshold decoder for decoding convolutional self-doubly orthogonal codes in accordance with the present invention.

FIG. 3 illustrates an exemplary embodiment of a threshold decoder stage 26. In FIG. 3, the threshold decoder stage 26 is comprised of a shift register with additional logic 41, selector 42, threshold logic apparatus 43, exclusive-or gate 44, and a syndrome correction selector 45. Shift register with additional logic 41 essentially stores the most recent to the least recent results of the exclusive-or gate 24 with the possible inversion of some of these results. The shift register 46 receives the most recently received information bit and stores the information bit in a K-bit FIFO register, thereby storing the most recently to the Kth least recently received information bits. The exclusive-or gate 44 of the threshold decoder stage 26 receives the least recently received information bit and the output of the threshold logic apparatus 43.

The selector 42 selects a set of the bits stored in shift register with additional logic 41 according to the inversion of the convolutional self-doubly orthogonal code generation. Selector 42 selects all or a subset of the syndrome bits stored in the shift register with additional logic 41. The selected syndrome bits were directly calculated from parity bits which were derived in part from the least recently received information bit. The threshold logic apparatus 43 receives the selected syndrome bits from the selector 42 and performs a threshold logic summing operation on the received syndrome bits. The threshold value of the threshold logic apparatus 43 is preset for each threshold decoding stage 26. If the sum of the syndrome bits is below the preset threshold of the threshold logic apparatus 43, an error correcting signal is initiated to invert the least recently received information bit of the threshold decoding stage 26 and to activate the syndrome correction selector 45 of the threshold decoder stage 26. When activated, the syndrome correction selector 45 selects the proper syndrome bits of the shift register with additional logic 41 to be inverted. These bits to be inverted are identical to those selected by selector 42. The threshold decoder stages can be implemented as separate identical stages each operating on the error corrected output of the previous stage in order to error correct the received information bit. The stages can also be implemented as one unit which iteratively error corrects the received information bit based on previous error correcting iterations. In each stage or iteration, variations in the set of selected syndrome bits which are selected based on the inversion of the encoder and the preset threshold can increase the accuracy of the decoder. For example, the syndrome bits are selected in relation to the preset threshold value such that the number of bits in each selected subset is proportional to a decrease in the threshold. The iterations or stages are terminated based on application specific limiting conditions such as decoder complexity, latency and target error performance. These limiting conditions require engineering design for each application.

Figure 4:
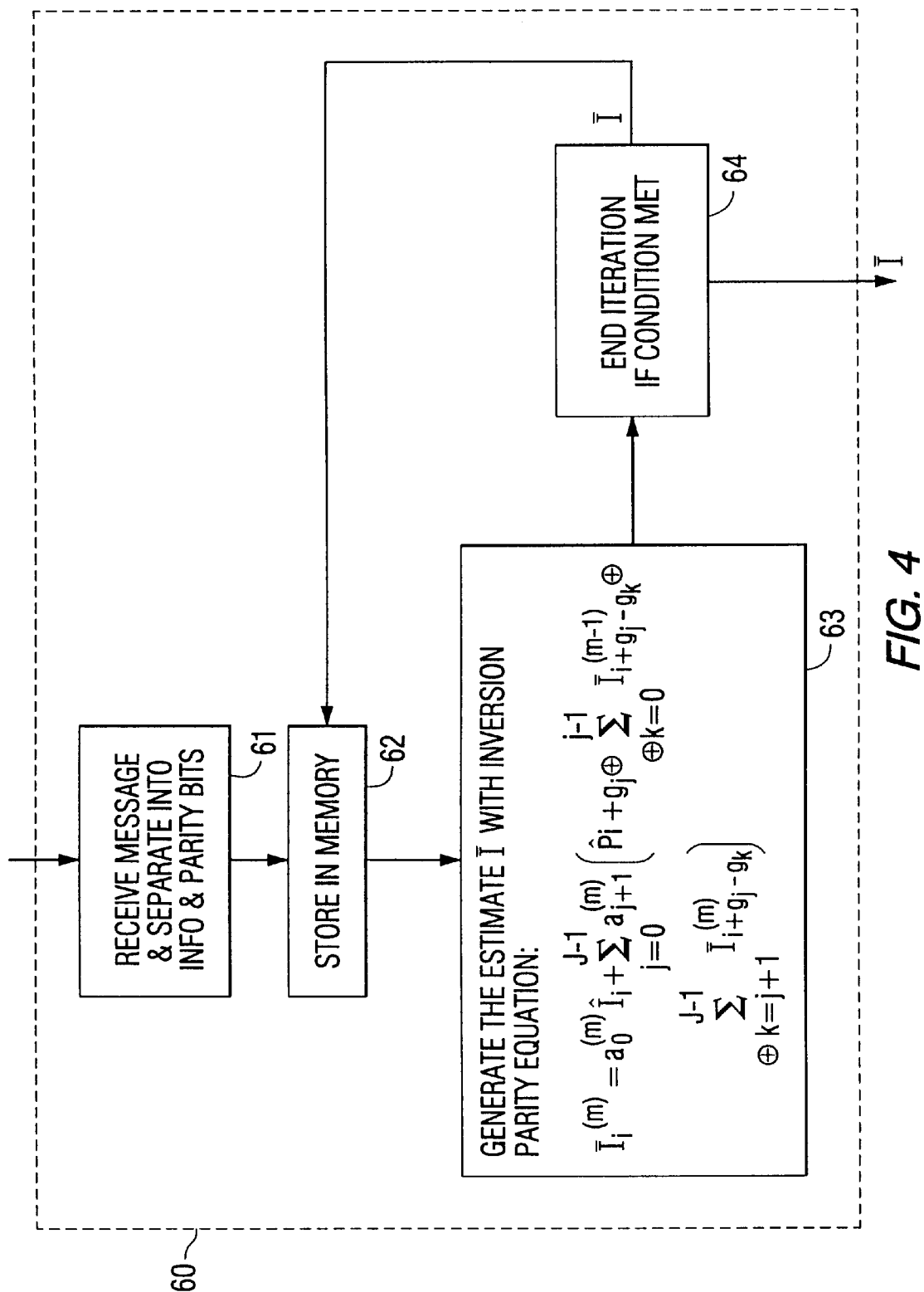
FIG. 4 is a block diagram illustrating, in an exemplary embodiment, a decoder for decoding convolutional self-doubly orthogonal codes in accordance with the present invention.

FIG. 4 illustrates an exemplary embodiment in block format of another embodiment of a convolutional self-doubly orthogonal decoder 60. The basic embodiment of FIG. 4 is comprised of a receiver 61, a storage device 62, a decoding unit 63, and a terminator 64. The receiver 61 receives the message transmitted through a noisy channel and separates the message into its information and parity bit components. The storage device 62 receives and stores in selectably accessible locations the stream of received information and parity bits from the receiver 61. The decoding unit 63 estimates the transmitted information bits from the inversion of the parity equation of the transmitted message based on received information and parity bits and estimated information and parity bits. The terminator 64 terminates the iterations of the decoding unit based on application specific limiting conditions such as decoder complexity, latency and target error performance. These limiting conditions are complex and require engineering design for each application.

The decoding unit 63 essentially implements the inversion of the parity equation for transmitted convolutional self-doubly orthogonal code. For example, for rate 1/2 systematic convolutional self-orthogonal codes for threshold decoding, encoding consists of generating a parity bit $P_i$ for each information bit $I_i$ to be transmitted at time, i, i=0, 1, 2, ... , where the parity bit is a function of the current bit and of the J−1 previous bits:

$$P_i = \sum_{\oplus j=0}^{J-1} I_{i-k_j}$$

where the sum is taken modulo-2, as denoted by the $\oplus$ symbol, with bit values +1 or −1, where +1 corresponds to the usual zero bit. The J values of $g_j$ specify the convolutional self-orthogonal code being used (e.g., convolutional self-doubly orthogonal code), and forms a difference set that is, their differences are distinct.

The decoding process consists of inverting the J parity equations associated with each information bit by using only the sign of the received bit values. The received value and each parity equation generate (J+1) estimates and a weighted combination of these estimates produces the maximum a posteriori probability "MAP" value of the decoded bit. The weighing values can be determined according to the amplitude of each received symbol. These estimates may be approximated by the introduction of an add-min operator, denoted by the same symbol $\oplus$, which produces the same modulo-2 addition on the sign of the operands but with an amplitude value equal to the minimum of the absolute values of the operands, that is, $x \oplus y = \text{sign}(x)\text{sign}(y)\min(|x|,|y|)$. The approximated MAP decoder then consists in producing a decoded bit, $\bar{I}_i$, according to the following expression:

$$\bar{I}_i = \hat{I}_i + \sum_{j=0}^{J-1} I^e_{i,j} = \hat{I}_i + \sum_{J=0}^{J-1}\left(\hat{P}_{i+g_j} \oplus \sum_{\oplus k=0, k \neq j}^{J-1} \hat{I}_{i+g_j-g_k}\right)$$

where $I^e_{i,j}$ are the J estimates obtained through parity-check equation inversion, and where the outermost sum is the usual sum on real numbers. The received information and parity bit streams which were transmitted over an Additive White Gaussian Noise, AWGN, channel are denoted as $\hat{I}_i$ and $\hat{P}_i$ respectively. Calculating the Log-Likelihood Ratio, LLR, is simple since the observables in this expression are all independent, or equivalently, each Gaussian random variable $\hat{P}_{i+g_j}$ and $\hat{I}_{i+g_j-g_k}$ appears only once in the equation for a given i.

In the usual feedback form of threshold decoding, when $g_j-g_k$ is smaller than zero, the past decoded bits are used instead of the received symbol. Hence the decoder equation may be written as:

$$\bar{I}_i = \hat{I}_i + \sum_{j=0}^{J-1} I^e_{i,j} \qquad (1)$$

$$= \hat{I}_i + \sum_{j=0}^{J-1}\left(\hat{P}_{i+g_j} \oplus \sum_{\oplus k=0}^{j-1} \bar{I}_{i+g_j-g_k} \oplus \sum_{\oplus k=j+1}^{J-1} \hat{I}_{i+g_j-g_k}\right)$$

where the generator values $g_j$ are assumed to be increasing with j. These past decisions $\bar{I}$ are considered close to error-free. However, they are in fact random variables which should be treated as dependent random variables.

Iteratively applying equation (1) with a gain smaller than 1 for the estimates generated by the parity check inversion equation produces the following result:

$$\bar{I}_i^{(m)} = \hat{I}_i + a^{(m)}\sum_{j=0}^{J-1} I^{e(m)}_{i,j} \qquad (2)$$

$$= \hat{I}_i + a^{(m)}\sum_{j=0}^{J-1}\left(\hat{P}_{i+s_j} \oplus \sum_{\oplus k=0}^{j-1} \bar{I}^{(m-1)}_{i+g_j-g_k} \oplus \sum_{\oplus k=j+1}^{J-1} \hat{I}^{(m)}_{i+g_j-g_k}\right)$$

where the gains $a^{(m)}$ serve the same purpose as the thresholds above. To obtain a more flexible arrangement, we may insert the gains in the outer sum and then adjust them individually for each estimate and add an overall gain on the received information sequence:

$$\hat{I}_i^{(m)} = a_0^{(m)} \hat{I}_i + \sum_{j=0}^{J-1} a_{j+1}^{(m)} I_{i,j}^{e(m)}$$

$$= a_0^{(m)} \hat{I}_i + \sum_{j=0}^{J-1} a_{j+1}^{(m)} \left( \hat{P}_{i+g_j} \oplus \sum_{\oplus k=0}^{j-1} \hat{I}_{i+g_j-g_k}^{(m-1)} \oplus \sum_{\oplus k=j+1}^{J-1} \hat{I}_{i+g_j-g_k}^{(m)} \right)$$

For Viterbi-like iterative decoding of convolutional codes, an interleaver is used to insure that decoding is applied on independent sets of observables. To obtain the same effect without interleaving, apply equation (2) recursively to the transmitted convolutional self-doubly orthogonal code for the first two decoding steps, that is m=1 and m=2. For m=2 the results of the second step may be written as:

$$\hat{I}_i^{(2)} = a_0^{(2)} \hat{I}_i + \sum_{j=0}^{J-1} a_{j+1}^{(2)} I_{i,j}^{e(2)}$$

$$= a_0^{(2)} \hat{I}_i + \sum_{j=0}^{J-1} a_{j+1}^{(2)} \left( \hat{P}_{i+g_j} \oplus \sum_{\oplus k=j+1}^{J-1} \hat{I}_{i+g_j-g_k} \oplus \right.$$

$$\sum_{\oplus k=0}^{j-1} \left( a_0^{(1)} \hat{I}_{i+g_j-g_k} + \sum_{n=0, cond(n)}^{J-1} a_{n+1}^{(1)} (\hat{P}_{i+g_j+g_k+g_n} \oplus \right.$$

$$\left. \left. \sum_{\oplus p=0}^{n-1} \hat{I}_{i+g_j-g_k+g_n-g_p} \oplus \sum_{\oplus p=n+1}^{J-1} \hat{I}_{i+g_j-g_k+g_n-g_p}^{(1)} \right) \right)$$

where the past decision of each decoding step has not been expanded into its channel symbol constituents. These decisions are assumed to be error-free as compared with the channel symbols with which they are combined by the add-min operator. A condition on n is added on the $4^{th}$ summation of (3), this condition is needed for a strict MAP estimate. To obtain equation (3) as a function of independent observables, we observe that the terms $(g_j-g_k+g_n-g_p)$, $(g_j-g_k+g_n)$ and $(g_j-g_k)$ need to be distinct for all the valid combinations of indices, that is: $0 \leq j<J$, $0 \leq k<j$, $0 \leq n<J$, $0 \leq p<n$, $n \neq k$, $p<k$. This is however impossible without a further condition on n, since $g_k$ may be equal to $g_n$ or also since $g_k$ and $g_p$ may be permuted. The condition may only be on n or else the parity equation inversion becomes invalid. A condition on n only implies that not all estimates of the previous decoder are used for the current decoding. A necessary condition would then be n<k. Other conditions on n depending on the complexity, the error propagation characteristics, and proportion of dependent variable over all the observables may also be implemented.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A rate 1/2 convolutional encoder for encoding self-doubly orthogonal code comprising:

a. data converter means for receiving a serial input of information bits and for providing, for each received input information bit, a corresponding parallel output of a group of K most recently received information bit through a least recently received information bit respectively identified as first through $K^{th}$ information bits; and b. self-doubly orthogonal coder means for receiving each group of K information bits, for selecting a sequence of L information bits $I_{gl}$ based on generator $g_l=\{g_0, g_1, g_2, \ldots, g_{L-1}\}$ such that for all variations of indices j, k, n, and p where $0 \leq j<L$, $0 \leq k<j$, $0 \leq n<L$, $0 \leq p<n$, $n \neq k$, $p \leq k$, except for unavoidable cases the differences of $(g_j-g_k)$ are distinct, the sum of differences $(g_j-g_k+g_n-g_p)$ are distinct, and the differences of $(g_j-g_k)$ are distinct from the sum of differences $(g_j-g_k+g_n-g_p)$, and for each group of K information bits a corresponding parallel output of L sequence information bits; and c. exclusive-or means for receiving each group of L information bits, for generating a parity bit by performing a logical exclusive-or operation on said L sequence for each received group of K information bits, and for an output of parity bit; and d. transmitter means for packaging the parity bits and information bits into coded messages and for transmitting these messages through a communication channel.

2. The rate 1/2 convolutional encoder of claim 1, wherein said self-doubly orthogonal generator means further generates sequences such that for all variations of W pairs of additional indices $q_u$ and $r_u$ where $1 \leq u \leq W$, $0 \leq q_u<L$, $0 \leq r_u<q_u$, $n \neq q_u \neq k$, $r_u<p<k$, except for unavoidable cases are the differences of $g_n$ for each pair of indices $q_u$ and $r_u$, $(g_q-g_r)$ are distinct, the sum of differences $(g_j-g_k+g_n-g_p)$ are distinct, the sum of differences $$\left( g_j - g_k + g_n - g_p + \sum_{u=1}^{W} (g_{q_u} - g_{r_u}) \right)$$

are distinct, all sums of differences are distinct from all differences, and all the differences are distinct from each other.

3. The rate 1/2 convolutional encoder of claim 1 wherein said data converter means comprises a shift register having a data input, a clock input and K register stages each with a corresponding stage output.

4. The rate 1/2 convolutional encoder of claim 1 wherein said self-doubly orthogonal generator means comprises a shift register having L stages and a clock input.

5. An error correcting decoder for a rate 1/2 convolutionally self-doubly orthogonal codes comprising:

a. a data receiver means for serially receiving convolutionally self-doubly orthogonal coded messages transmitted over a noisy medium, and for each received message, a corresponding parallel output of the information and parity bits of the received message; and b. a rate 1/2 encoder means for serially receiving the received information bits, for storing a group of K most recently received bits through a least recently received information bit, for estimating the most recently received parity bit from the first through $K^{th}$ information bits by convolutionally self-doubly orthogonal coding the information bits, and for each group of K information bits, a corresponding serial output of the estimated parity bit; and c. an Exclusive-Or means for serially receiving said received message parity bit, for serially receiving said estimated parity bit, for performing a logical exclusive-or operation on said received message parity bit and estimated parity bit, and for each group of received message parity bit and estimated parity bit, a corresponding serial output; and d. a syndrome means for serially receiving said serial output of the Exclusive-Or means, for storing a group of K most recently received through least recently received output bit of said Exclusive-Or means, for each group of K, selecting a group of J bits according to code generators, and for each group of K stored bits, a corresponding parallel output of the J selected bits; and e. a threshold logic means for receiving said group of J parallel outputs from said syndrome means, for summing said J inputs, for comparing the sum to a preset threshold, and for each group of J inputs a corresponding serial output of the comparison; and f. an error correcting means for serially receiving the output of the threshold logic means, for error correcting the most recently received message information bit by inversion, and for error correcting the outputs stored in said syndrome means by inversion; and g. m subsequent stages, each stage comprising a syndrome means, a threshold logic means, and an error correcting means, such that each stage operates on the error corrected output of the previous stage.

6. The error correcting decoder of claim 5 in which said syndrome means in each subsequent stage selects a subset of the sequence selected.

7. The error correcting decoder of claim 6, wherein the preset threshold of the threshold logic means of each stage is greater than or equal to the preset threshold of each subsequent stage.

8. The error correcting decoder of claim 7, wherein, in each stage of said error correcting decoder, the number of bits in each selected subset in the syndrome means is proportional to a decrease in the threshold in the threshold logic means.

9. The error correcting decoder of claim 5, wherein the preset threshold of the threshold logic means of each stage is greater than or equal to the preset threshold of each subsequent stage.

10. The error correcting decoder of claim 5, wherein said error correcting decoder further comprising an amplitude measuring means for measuring amplitudes of received messages and conditioning means for weighing the inputs of the Exclusive-Or gate based on the measured amplitudes.

11. The error correcting decoder of claim 5, said error correcting decoder comprising at least one stage comprising:

an accumulator for serially receiving said information (I) and parity (P) bits from said data receiver, for storing a group of K most recently received information and parity bits through a least recently received information and parity bits, for providing selectable access to stored bits, and for an output of selected bits; and an iterative threshold decoding and error correcting means for selectable accessing the stored bits in said accumulator, for each iteration estimating the least recently received information bit based on inversion of the parity equation of the received message, said inversion equation operating on the most recently received I bits, the most recently received P bits, previously received P bits, a preset sequence of previously received I bits, and estimates of previously received I bits, for each iteration a threshold comparison of the estimated information bit and the received bit.

12. The error correcting decoder of claim 5, wherein said syndrome means further comprising:

a. a sequence selector means for selecting J of the K outputs of said Exclusive-Or means such that each selected output $S_j$ was derived from all of the K information bits which directly affected coding of the received parity bit P.

13. The error correcting decoder of claim 5, wherein said error correcting decoder further comprising condition means for limiting the number of stages.

14. An error correcting decoder for convolutionally self-doubly orthogonal code comprising:

a. a data receiver means for serially receiving convolutionally self-doubly orthogonal coded messages transmitted over a noisy medium, and for each received message, a corresponding parallel output of the information (I) and parity (P) bits of the received message; and b. an accumulator for serially receiving said information and parity bits from said data receiver, for storing a group of K most recently received information and parity bits through a least recently received information and parity bits, for providing selectable access to stored bits, and for an output of selected bits; and c. an iterative threshold decoding and error correcting means for selectably accessing the stored bits in said accumulator, for each iteration estimating the least recently received information bit based on inversion of the parity equation of the received message, said inversion equation operating on the most recently received I bits, the most recently received P bits, previously received P bits, a preset sequence of previously received I bits, and estimates of previously received I bits, for each iteration a threshold comparison of the estimated information bit and the received bit.

15. The error correcting decoder of claim 14, said iterative threshold decoding and error correcting means further comprising a decorrelator means for conditioning the operation of the parity inversion equation based on the log likelihood or an approximation of the log likelihood of said information.

16. The error correcting decoder of claim 14, said iterative threshold decoding and error correcting means further comprising a weighing means for measuring the received amplitudes of the K stored messages, and for weighing the values of previously received information and parity bits in the operation of the parity inversion equation.

17. The error correcting decoder of claim 16, wherein said iterative threshold decoding and error correcting means further comprising a balancing means for adjusting said weights according to the number of iterations.

18. The error correcting decoder of claim 14, wherein said error correcting decoder further comprising an amplitude measuring means for measuring the amplitude of received message bits and weighing means for weighing iteration estimates of said iterative threshold decoding and error correcting means based on the measured amplitudes of the bits under consideration.

19. The error correcting decoder of claim 14, wherein said iterative threshold decoding and error correcting means further comprises a condition means for conditioning each iteration of the parity inversion equation based on the log likelihood or an approximation of the log likelihood of said information.

20. The error correcting decoder of claim 14, wherein said iterative threshold decoding and error correcting means further comprising a limiting means for limiting the number of iterations.

21. An encoder comprising a convolutional self-doubly orthogonal encoder for coding rate b/v, $1 \leq b < v$, v=2, 3, 4, . . . , where b parallel information is input to b data converter means and where (v−b) convolutional self-doubly orthogonal parity bits are generated.

22. A decoder comprising an iterative threshold decoder of convolutional self-doubly orthogonal code for coding rates b/v, $1 \leq b < v$, v=2, 3, 4, . . . , where b parallel information and (v−b) convolutional self-doubly orthogonal encoded parallel parities are iteratively threshold decoded generating b parallel decoded bits.

* * * * *